(12) United States Patent
Suh et al.

(10) Patent No.: US 12,154,936 B2
(45) Date of Patent: Nov. 26, 2024

(54) DISPLAY MODULE AND MANUFACTURING METHOD THEREOF

(71) Applicant: SAMSUNG ELECTRONICS CO., LTD., Suwon-si (KR)

(72) Inventors: Jenghun Suh, Suwon-si (KR); Jihoon Kang, Suwon-si (KR); Myunghee Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 401 days.

(21) Appl. No.: 17/518,101

(22) Filed: Nov. 3, 2021

(65) Prior Publication Data
US 2022/0246673 A1 Aug. 4, 2022

Related U.S. Application Data

(63) Continuation of application No. PCT/KR2021/013788, filed on Oct. 7, 2021.

(30) Foreign Application Priority Data

Feb. 2, 2021 (KR) .......................... 10-2021-0014808

(51) Int. Cl.
*H01L 27/15* (2006.01)
*H01L 33/00* (2010.01)
(Continued)

(52) U.S. Cl.
CPC .......... *H01L 27/156* (2013.01); *H01L 33/005* (2013.01); *H01L 33/10* (2013.01); *H01L 33/504* (2013.01); *H01L 2933/0041* (2013.01)

(58) Field of Classification Search
CPC ..... H01L 27/156; H01L 33/005; H01L 33/10; H01L 33/504; H01L 2933/0041; H01L 33/507; H01L 33/46; H01L 25/0753
See application file for complete search history.

(56) References Cited

U.S. PATENT DOCUMENTS 9,837,388 B2 12/2017 Rhee et al.
9,935,153 B1 4/2018 Jung et al.
(Continued)

FOREIGN PATENT DOCUMENTS

CN 111710800 A 9/2020
JP 2002094185 A 3/2002
(Continued)

OTHER PUBLICATIONS

International Search Report (PCT/ISA/210) issued Jan. 24, 2022 by the International Searching Authority in International Patent Application No. PCT/KR2021/013788.
(Continued)

*Primary Examiner* — Jarrett J Stark
(74) *Attorney, Agent, or Firm* — Sughrue Mion, PLLC

(57) ABSTRACT

A display module includes a substrate, and a plurality of pixels provided on the substrate, wherein each of the plurality of pixels includes a first inorganic light emitting element including a distributed Bragg reflectors (DBR) layer, a second inorganic light emitting element including a DBR layer, a third inorganic light emitting element, a first color conversion layer provided adjacent to the first inorganic light emitting element, a second color conversion layer provided adjacent to the second inorganic light emitting element, and a first color filter provided adjacent to the first color conversion layer, a second color filter provided adjacent to the second color conversion layer, wherein a size of the first color conversion layer is larger than a size of the first inorganic light emitting element, and a size of the second color conversion layer is larger than a size of the second inorganic light emitting element.

18 Claims, 19 Drawing Sheets

(51) Int. Cl.
  *H01L 33/10* (2010.01)
  *H01L 33/50* (2010.01)

(56) References Cited

U.S. PATENT DOCUMENTS

| | | | |
|---|---|---|---|
| 9,971,198 B2 | 5/2018 | Cho et al. | |
| 10,481,432 B2 | 11/2019 | Cho et al. | |
| 10,763,399 B2 | 9/2020 | Lee et al. | |
| 10,763,409 B2 | 9/2020 | Yeh et al. | |
| 10,796,627 B2 | 10/2020 | Pan | |
| 10,861,906 B2 | 12/2020 | Park et al. | |
| 10,914,986 B2 | 2/2021 | Cho et al. | |
| 10,930,824 B2 | 2/2021 | Han | |
| 11,398,500 B2 | 7/2022 | Sakong et al. | |
| 2011/0299044 A1* | 12/2011 | Yeh | H04N 9/315 353/52 |
| 2012/0112220 A1* | 5/2012 | West | H01L 33/62 257/E33.072 |
| 2013/0330853 A1* | 12/2013 | Tischler | H01L 24/83 438/27 |
| 2014/0160408 A1 | 6/2014 | Cho et al. | |
| 2015/0362165 A1* | 12/2015 | Chu | H01L 33/32 362/235 |
| 2017/0315409 A1 | 11/2017 | Cho et al. | |
| 2018/0182931 A1* | 6/2018 | Lee | H01L 33/50 |
| 2019/0113799 A1* | 4/2019 | Shin | G02F 1/13363 |
| 2019/0179065 A1* | 6/2019 | Kim | G02B 5/201 |
| 2019/0189858 A1 | 6/2019 | Li et al. | |
| 2019/0198735 A1* | 6/2019 | Tsai | H01L 33/06 |
| 2019/0237634 A1* | 8/2019 | Nakabayashi | H01L 33/60 |
| 2019/0244937 A1* | 8/2019 | Honjo | G02B 5/20 |
| 2019/0295996 A1 | 9/2019 | Park et al. | |
| 2019/0305192 A1 | 10/2019 | Han | |
| 2019/0355881 A1 | 11/2019 | Yeh et al. | |
| 2019/0355883 A1 | 11/2019 | Yeh et al. | |
| 2019/0378873 A1* | 12/2019 | Lee | H01L 25/0655 |
| 2020/0044129 A1* | 2/2020 | Hashimoto | H01L 25/0753 |
| 2020/0050060 A1 | 2/2020 | Cho et al. | |
| 2020/0083198 A1* | 3/2020 | Kuo | H01L 33/46 |
| 2020/0083421 A1* | 3/2020 | Nakabayashi | H01L 33/486 |
| 2020/0127169 A1* | 4/2020 | Ahmed | H01L 33/42 |
| 2020/0152693 A1 | 5/2020 | Zou et al. | |
| 2021/0013236 A1 | 1/2021 | Sakong et al. | |
| 2021/0175396 A1 | 6/2021 | Han | |
| 2021/0183301 A1* | 6/2021 | Choi | H01L 33/346 |
| 2021/0328114 A1* | 10/2021 | Tangring | C09K 11/02 |
| 2021/0366981 A1* | 11/2021 | Yeon | H01L 33/502 |
| 2022/0045132 A1* | 2/2022 | Lee | H10K 50/844 |
| 2022/0052120 A1* | 2/2022 | Park | G02B 5/201 |
| 2022/0229222 A1* | 7/2022 | Yuan | G02B 6/0053 |
| 2022/0246673 A1* | 8/2022 | Suh | H01L 27/156 |
| 2023/0005899 A1* | 1/2023 | Kim | H01L 33/62 |
| 2023/0163260 A1* | 5/2023 | Kang | H01L 33/382 257/79 |
| 2023/0268470 A1* | 8/2023 | Kuo | H01L 25/167 257/91 |
| 2023/0369546 A1* | 11/2023 | Chen | H01L 33/504 |
| 2024/0021769 A1* | 1/2024 | Do | H01L 25/0753 |

FOREIGN PATENT DOCUMENTS

| | | |
|---|---|---|
| KR | 10-2018-0063687 A | 6/2018 |
| KR | 10-2018-0076066 A | 7/2018 |
| KR | 10-2020-0060703 A | 6/2020 |
| KR | 10-2020-0068022 A | 6/2020 |
| KR | 102135352 B1 | 7/2020 |
| KR | 10-2020-0130320 A | 11/2020 |
| KR | 10-2021-0006567 A | 1/2021 |

OTHER PUBLICATIONS

Written Opinion (PCT/ISA/237) issued Jan. 24, 2022 by the International Searching Authority in International Patent Application No. PCT/KR2021/013788.

\* cited by examiner

DISPLAY MODULE AND MANUFACTURING METHOD THEREOF

CROSS-REFERENCE TO RELATED APPLICATIONS

This application is a bypass continuation of International Application No. PCT/KR2021/013788, filed on Oct. 7, 2021, which is based on and claims priority to Korean Patent Application No. 10-2021-0014808, filed on Feb. 2, 2021, in the Korean Intellectual Property Office, the disclosures of which are incorporated by reference herein in their entireties.

BACKGROUND

Field

The disclosure relates to a display module using a self-luminescence element for displaying an image and a method of manufacturing thereof.

Description of Related Art

When a self-luminescence element for displaying an image is used in a display panel, an image may be displayed without a backlight. The display panel is operated in units of pixels or sub-pixels composed of self-luminescence elements to express various colors. Operations of each pixel or sub-pixel may be controlled by a thin film transistor (TFT).

In a related art display panel using a self-luminescence element, color distribution exists within a module due to a distribution of emission wavelengths between self-luminescence elements, and when the temperature increases, an efficiency of a red self-luminescence element is greatly reduced compared to an efficiency of green and blue self-luminescence elements, and therefore there is a problem that a color temperature determined by an RGB luminance ratio changes.

In order to solve the problem described above, a display panel having a monochromatic self-luminescence element and a color conversion layer has been developed. However, since side light and back light of a self-luminescence element used as excitation light do not reach the color conversion layer, only a portion of a total amount of light emitted is absorbed and converted by the color conversion layer, such that a luminous efficiency of the display panel is reduced.

SUMMARY

Provided is a display module that maximizes luminous efficiency by using a micro self-luminescence element in which light is concentrated in a front direction, and a method of manufacturing thereof.

According to an aspect of the disclosure, there is provided a display module including a substrate, and a plurality of pixels provided on the substrate, wherein each of the plurality of pixels includes a first inorganic light emitting element including a distributed Bragg reflectors (DBR) layer, a second inorganic light emitting element including a DBR layer, a third inorganic light emitting element, a first color conversion layer provided adjacent to the first inorganic light emitting element, a second color conversion layer provided adjacent to the second inorganic light emitting element, and a first color filter provided adjacent to the first color conversion layer, a second color filter provided adjacent to the second color conversion layer, wherein a size of the first color conversion layer is larger than a size of the first inorganic light emitting element and a size of the second color conversion layer is larger than a size of the second inorganic light emitting element.

Each of the first inorganic light emitting element, the second inorganic light emitting element, and the third inorganic light emitting element may be a blue micro light emitting diode (LED).

The display module may further include a partition wall partitioning the first inorganic light emitting element, the second inorganic light emitting element, and the third inorganic light emitting element, and the partition wall may be configured to reflect light emitted from a side surface of the first color conversion layer and reflect light emitted from a side surface of the second color conversion layer.

The partition wall may have a white-like color.

The display module may further include a metal film provided on a surface of the partition wall.

Each side surface of the first inorganic light emitting element, the second inorganic light emitting element, and the third inorganic light emitting element may be adhered to the partition wall by an optical adhesive.

A first portion of a surface of the first color conversion layer may contact the optical adhesive and the first portion does not correspond to a light emitting surface of the first inorganic light emitting element, and a second portion of a surface of the second color conversion layer may contact the optical adhesive and the second portion does not correspond to a light emitting surface of the second inorganic light emitting element.

The optical adhesive may be a ultraviolet (UV) curing silicone rubber.

The first color conversion layer may include a first color conversion material configured to emit light in a red wavelength band, and the second color conversion layer may include a second color conversion material configured to emit light in a green wavelength band.

The first color conversion material may be a red nano phosphor, and the second color conversion material may be a green nano phosphor.

The red nano phosphor may be $Si_{1-x}Ca_xAlSiN_3:Eu2+$.

The green nano phosphor may be $Si_{6-z}Al_zO_zN_{8-z}:Eu2+$ or $SrGa_2S_4$.

Each of the red nano phosphor and the green nano phosphor may have an average value (d50) in particle size distribution of less than 0.5 μm.

According to an aspect of the disclosure, there is provided a method of manufacturing a display module, the method including manufacturing a first portion of the display module by sequentially forming a color filter, a planarization layer and a color conversion layer on a substrate, manufacturing a second portion of the display module by transferring a plurality of inorganic light emitting elements to the substrate, aligning the color conversion layer included in the first portion and an inorganic light emitting element among the plurality of inorganic light emitting elements of the second portion to correspond to each other, and bonding the first portion and the second portion, wherein at least two of the plurality of inorganic light emitting elements include a distributed Bragg reflectors (DBR) layer.

The manufacturing the first portion may further include forming a black matrix on the substrate in a mesh shape, forming the color filter on the substrate, forming the planarization layer on the color filter, forming a partition wall partitioning the first portion into sub pixel areas on the planarization layer, and filling the color conversion layer in spaces partitioned by the partition wall.

According to an aspect of the disclosure, there is provided a display module including a substrate, and a plurality of pixels provided on the substrate, wherein each of the plurality of pixels includes a first inorganic light emitting element including a distributed Bragg reflectors (DBR) layer, a second inorganic light emitting element including a DBR layer, a third inorganic light emitting element including a DBR layer, a first color conversion layer provided adjacent to the first inorganic light emitting element, a second color conversion layer provided adjacent to the second inorganic light emitting element, a third color conversion layer provided adjacent to the third inorganic light emitting element, a first color filter provided adjacent to the first color conversion layer, a second color filter provided adjacent to the second color conversion layer, and a third color filter provided adjacent to the third color conversion layer, wherein a size of each of the first color conversion layer, the second color conversion layer, and the third color conversion layer is larger than a size of each of the first inorganic light emitting element, the second inorganic light emitting element, and the third inorganic light emitting element.

The display module further includes a partition wall that partitions the first inorganic light emitting element, the second inorganic light emitting element, and the third inorganic light emitting element, and the partition wall may be configured to reflect light emitted from a side surface of the first color conversion layer, reflect light emitted from a side surface of the second color conversion layer, and reflect light emitted from a side surface of the third color conversion layer.

The partition wall may have a white-like color.

A metal film may be provided on a surface of the partition wall.

A side surface of each of the first inorganic light emitting element, the second inorganic light emitting element, and the third inorganic light emitting element may be adhered to the partition wall by an optical adhesive.

DETAILED DESCRIPTION

Figure 1:
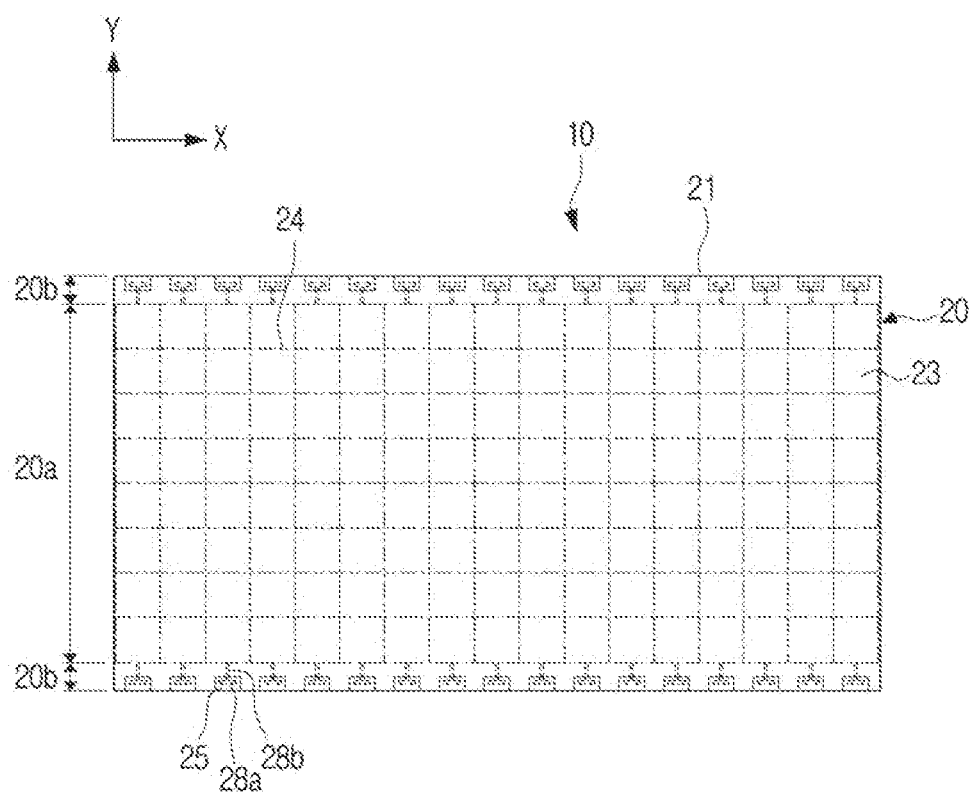
FIG. 1 is a front view illustrating a display module according to an embodiment.

Example embodiments will now be described in detail with reference to the accompanying drawings. The example embodiments described herein can be variously modified. Aspects of example embodiments are described in the drawings and may be described in detail in the detailed description. It should be understood, however, that the specific example embodiments illustrated in the accompanying drawings are only intended to facilitate understanding of the various example embodiments. Accordingly, it is to be understood that the technical idea is not limited by the specific example embodiments illustrated in the accompanying drawings, but includes all equivalents or alternatives falling within the spirit and scope of the disclosure.

Terms including ordinals, such as first, second, etc., may be used to describe various elements, but such elements are not limited to the above terms. The above terms are used only for the purpose of distinguishing one component from another.

The expression such as "comprise" or "have" as used herein is intended to designate existence of a characteristic, number, step, operation, element, part or a combination thereof as specified in the description, and should not be construed as foreclosing possible existence or addition of one or more of the other characteristics, numbers, steps, operations, elements, parts or a combination thereof. It is to be understood that when an element is referred to as being "connected" or "accessed" to another element, it may be directly connected or accessed to the other element, but it should be understood that there may be other components in between. When an element is referred to as being "directly connected" or "directly accessed" to another element, it should be understood that there are no other elements in between.

In the present disclosure, the term "same" means not only completely coincident, but also includes differences in a degree taking into account the processing error range.

In describing example embodiments, detailed description of relevant known functions or components may be omitted if it would obscure the description of the subject matter.

In the present disclosure, the display module may be a display panel including a micro light emitting diode, which is a self-luminescence element for displaying an image. Compared to liquid crystal display (LCD) panels, which are one of flat panel display panels that are composed of a plurality of inorganic light emitting diodes (LEDs) each less than 100 micrometers and require a backlight, the display module provides better contrast, response time and energy efficiency. The display module does not need to include a separate backlight because the micro light emitting diode used for displaying an image is a self-luminescence element.

In the present disclosure, both the organic light emitting diode (OLED) and the inorganic light emitting device including the micro LED have good energy efficiency, but the micro LED is brighter and has higher luminous efficiency and longer lifespan than the OLED. The micro LED may be a semiconductor chip capable of emitting light by itself when power is supplied. The micro LED has faster response speed, lower power, and higher luminance. For example, the micro LED has a higher efficiency of converting electricity into photons than a conventional liquid crystal display (LCD) or organic light emitting diode (OLED). For example, the micro LED has a higher brightness per watt compared to related LCD or OLED displays. Accordingly, the micro LED may produce the same brightness with about half an energy of the conventional LED, each exceeding 100 μm in width, length, and height, or OLED. In addition, the micro LED may realize high resolution, excellent color, contrast and brightness, and thus the micro LED may more accurately express a wide range of colors, and may realize a clear screen even in bright outdoor environments. In addition, the micro LED is stronger against burn-in and has lower heat generation, and thus a long lifespan is guaranteed without deformation. The micro LED may have a flip chip structure in which anode and cathode electrodes are formed on the same first surface and a light emitting surface is formed on a second surface opposite to the first surface on which the electrodes are formed.

In the present disclosure, one pixel may include at least three sub-pixels. One sub-pixel is a micro self-luminescence element for displaying an image, for example, vertical cavity surface emitting laser (VCSEL) diode, micro light emitting diode (micro-LED), blue micro light emitting diode (LED) or ultraviolet micro light emitting diode (UV micro LED). Here, the blue micro LED may be a self-luminescence element emitting light in a blue wavelength band (450 to 490 nm), and the UV micro LED may be a self-luminescence element emitting light in an ultraviolet wavelength band (360 to 410 nm).

In the present disclosure, one sub-pixel may include a color conversion layer and a color filter corresponding thereto along with one micro self-luminescence element. The color conversion layer may be excited by light emitted from the micro light emitting device to emit a color of a predetermined wavelength band. The color conversion layer may be composed of a material including nano phosphors or quantum dots.

In the present disclosure, one sub-pixel area means an area in which a color of a corresponding sub-pixel is expressed by light emitted from one sub-pixel. In the present disclosure, an area (horizontal length×vertical length) of one surface of the color conversion layer to which the sub-pixel corresponds may be greater than an area of a light-emitting surface of the sub-pixel. In this case, the sub-pixel area may correspond to the area of the color conversion layer.

In the present disclosure, a TFT layer in which a thin film transistor (TFT) circuit is formed may be disposed on a front surface of a substrate, and a power supply circuit for supplying power to the TFT circuit, a data driving driver, a gate driving driver, and a timing controller controlling each driving driver may be provided. A plurality of pixels arranged in the TFT layer may be driven by the TFT circuit.

In the present disclosure, the substrate may be, for example, a glass substrate, a synthetic resin-based substrate (for example, polyimide (PI), polyethylene terephthalate (PET), polyethersulfone (PES), polyethylene naphthalate (PEN), polycarbonate (PC), etc.) or a ceramic substrate.

In the present disclosure, a TFT layer having a TFT circuit formed thereon may be disposed on a front surface of the substrate, and no circuit may be disposed on a rear surface of the substrate. The TFT layer may be integrally formed on the substrate or may be manufactured in the form of a separate film and attached to one surface of a glass substrate.

In the present disclosure, the front surface of the substrate may be divided into an active area and a dummy area. The active area may correspond to an area occupied by the TFT layer on the front surface of the substrate, and the dummy area may be an area excluding the area occupied by the TFT layer on the front surface of the substrate.

In the present disclosure, an edge area of the substrate may be the outermost area of the glass substrate. In addition, the edge area of the substrate may be an area remaining except for an area in which circuits of the substrate are formed. Also, the edge area of the substrate may include a portion of the front surface of the substrate adjacent to the side surface of the substrate and a portion of the rear surface of the substrate adjacent to the side surface of the substrate. The substrate may be formed in a quadrangle shape. Specifically, the substrate may be formed in a rectangular shape or a square shape. The edge area of the substrate may include at least one side of four sides of the glass substrate.

In the present disclosure, TFT constituting a TFT layer (or backplane) is not limited to a particular structure or type. For example, a TFT recited in the present disclosure may be implemented as oxide TFT, silicon (Si) TFT (for example, poly silicon, a-silicon), organic TFT, graphene TFT, etc. in addition to low-temperature polycrystalline silicon TFT (LTPS TFT), and only P-type (or N type) MOSFET may be generated and applied in a Si wafer complementary metal-oxide-semiconductor (CMOS) process.

In the present disclosure, a pixel driving method of the display module may be an active matrix (AM) driving method or a passive matrix (PM) driving method. The display module may form a wiring pattern to which each micro LED is electrically connected according to the AM driving method or the PM driving method.

In the present disclosure, a plurality of pulse amplitude modulation (PAM) control circuits may be disposed in one-pixel area. In this case, each sub-pixel disposed in one-pixel area may be controlled by a corresponding PAM control circuit. Also, a plurality of pulse width modulation (PWM) control circuits may be disposed in one-pixel area. In this case, each sub-pixel disposed in one-pixel area may be controlled by a corresponding PWM control circuit.

In the present disclosure, a plurality of PAM control circuits and a plurality of PWM control circuits may be disposed together in one-pixel area. In this case, some of the sub-pixels disposed in one-pixel area may be controlled by the PAM control circuit and the rest may be controlled by the PWM control circuit. In addition, each sub-pixel may be controlled by the PAM control circuit and the PWM control circuit.

In the present disclosure, the display module may include a plurality of side wirings having a thin film thickness disposed at regular intervals along the side surface of the TFT substrate.

In the present disclosure, the display module may provide a plurality of through wiring members formed not to be exposed to the side of the TFT substrate instead of to the side wiring exposed to the side of the TFT substrate. Accordingly, bezel-less may be made and a mounting density of micro LEDs for display modules may be increased by minimizing the dummy areas on the front surface of the TFT substrate and maximizing the active areas In the present disclosure, a display module being bezel-less may provide a large-sized multi-display device capable of maximizing an active area when a plurality of devices are connected. In this case, each display module may be formed to maintain a pitch between pixels of adjacent display modules to be the same as a pitch between pixels in a single display module by minimizing a dummy area. Accordingly, it may be a method of preventing a seam from being viewed in a connection portion between each display module.

In the present disclosure, the driving circuit may be implemented by a micro IC disposed in a pixel area to control driving of at least 2n pixels. In the case of applying the micro IC to the display module, only a channel layer connecting the micro IC and each micro LED may be formed in the TFT layer (or backplane) instead of the TFT.

In the present disclosure, the display module is a single unit, and may be installed and applied to an electronic product or an electrical equipment requiring a wearable device, a portable device, a handheld device, and various displays, and may be applied to a display apparatus such as a monitor for personal computer (PC), high-definition television (TV), and signage or digital signage, electronic display, or the like through a plurality of assembled arrangements in a matrix type.

Hereinafter, a display module according to an embodiment of the disclosure will be described with reference to the accompanying drawings.

Figure 2:
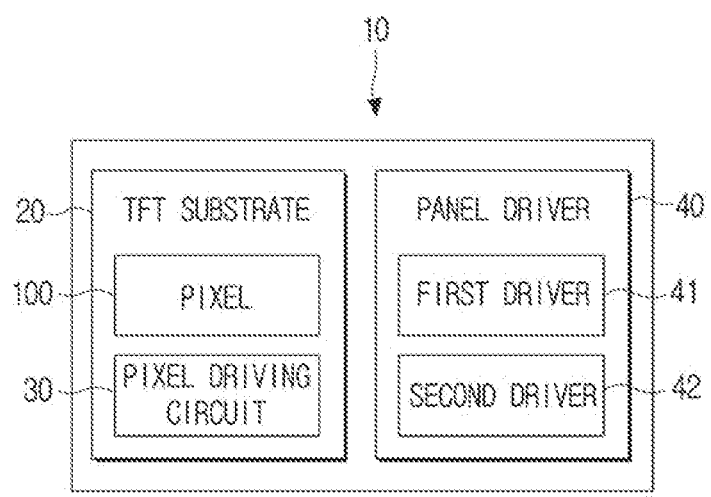
FIG. 2 is a block diagram illustrating a display module according to an embodiment.

FIG. 1 is a schematic front view illustrating a display module according to an embodiment, and FIG. 2 is a schematic block diagram illustrating a display module according to an embodiment.

Referring to FIGS. 1 and 2, the display module 10 according to the disclosure may include a TFT substrate 20 on which a plurality of pixel driving circuits 30 are formed, a plurality of pixels 100 arranged on a front surface of the TFT substrate 20, and a panel driver 40 that generates a control signal and provides the generated control signal to the plurality of pixel driving circuits 30.

In the present disclosure, one pixel may include a plurality of sub-pixels. One sub-pixel may include one light source, a color conversion layer corresponding to each light source, and a color filter. The light source may be an inorganic self-light emitting light source such as, for example, a vertical cavity surface emitting laser (VCSEL) diode having a size of 100 μm or less, or for example, 30 μm or less or a micro light emitting diode (LED). VCSEL diodes and micro LEDs may emit light in a blue wavelength band (450 to 490 nm) or light in an ultraviolet wavelength band (360 to 410 nm). The structure of a pixel 100 will be described in detail below with reference to FIG. 3.

The TFT substrate 20 may include a glass substrate 21, a TFT layer 23 including a thin film transistor (TFT) circuit on an entire surface of the glass substrate 21, a TFT circuit of the TFT layer 23, and a plurality of side wirings 25 for electrically connecting circuits disposed on the rear surface of the glass substrate 21.

In the present disclosure, the TFT substrate 20 may be a synthetic resin-based substrate (for example, polyimide (PI), polyethylene terephthalate (PET), polyethersulfone (PES), polyethylene naphthalate (PEN), polycarbonate (PC), etc.) or a ceramic substrate may be used.

The TFT substrate 20 may include an active area 20a that displays an image and a dummy area 20b that cannot display an image on its entire surface.

The active area 20a may be divided into a plurality of pixel areas 24 in which a plurality of pixels are respectively arranged. The plurality of pixel areas 24 may be partitioned in various shapes, and may be partitioned, for example, in a matrix shape. One pixel 100 (refer to FIG. 3) may be included in one-pixel area 24.

The dummy area 20b may be included in an edge area of a glass substrate 21, and a plurality of connection pads 28a may be disposed at regular intervals. Each of the plurality of connection pads 28a may be electrically connected to each pixel driving circuit 30 through a wiring 28b.

The number of connection pads 28a formed in the dummy area 20b may vary depending on the number of pixels implemented on the glass substrate and may vary depending on a driving method of a TFT circuit disposed in the active area 20a. For example, compared to a passive matrix (PM) driving method in which the TFT circuit disposed in the active area 20a drives a plurality of pixels in a horizontal line and a vertical line, an active matrix (AM) driving method in which the TFT circuit disposed on the active area 20a drives each pixel individually may require more wiring and connection pads.

The TFT layer 23 may include a plurality of data signal lines arranged horizontally, a plurality of gate signal lines arranged vertically, and a plurality of pixel driving circuits electrically connected to each line to control the plurality of pixels 100.

The panel driver 40 may be directly bonded to a TFT substrate through a chip on class (COG) or a chip on plastic (COP) bonding method. The panel driver 40 may also be connected to the TFT substrate 20 through a separate flexible printed circuit board (FPCB) using a film on glass (FOG) bonding method. The panel driver 40 may drive a plurality of pixel driving circuits to control light emission of a plurality of micro LEDs electrically connected to each of the plurality of pixel driving circuits 30.

The panel driver 40 may control the plurality of pixel driving circuits 30 for each line through a first driver 41 and a second driver 42. The first driver 41 may generate a control signal for sequentially controlling a plurality of horizontal lines formed on the TFT substrate 20, one line per image frame, and transmit the generated control signal to a pixel driving circuit 30 connected to the corresponding line, respectively. The second driver 42 may generate a control signal for sequentially controlling a plurality of vertical lines formed on the TFT substrate 20, transmit the generated control signal to the pixel driving circuits 30 connected to the corresponding line.

Figure 3:
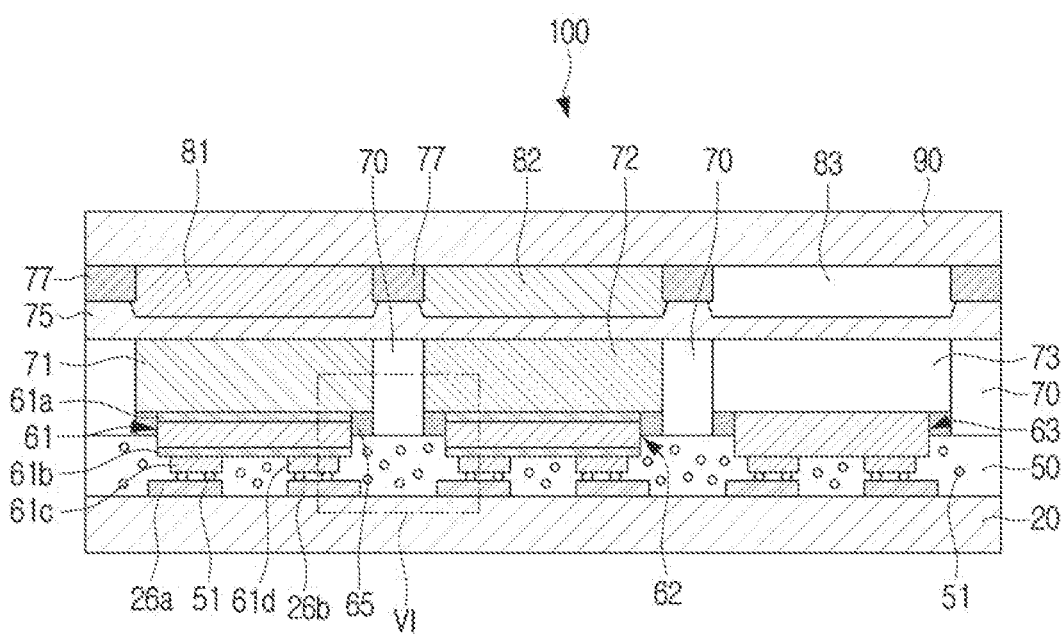
FIG. 3 is a cross-sectional view illustrating a single pixel of a display module according to an embodiment.
Figure 4:
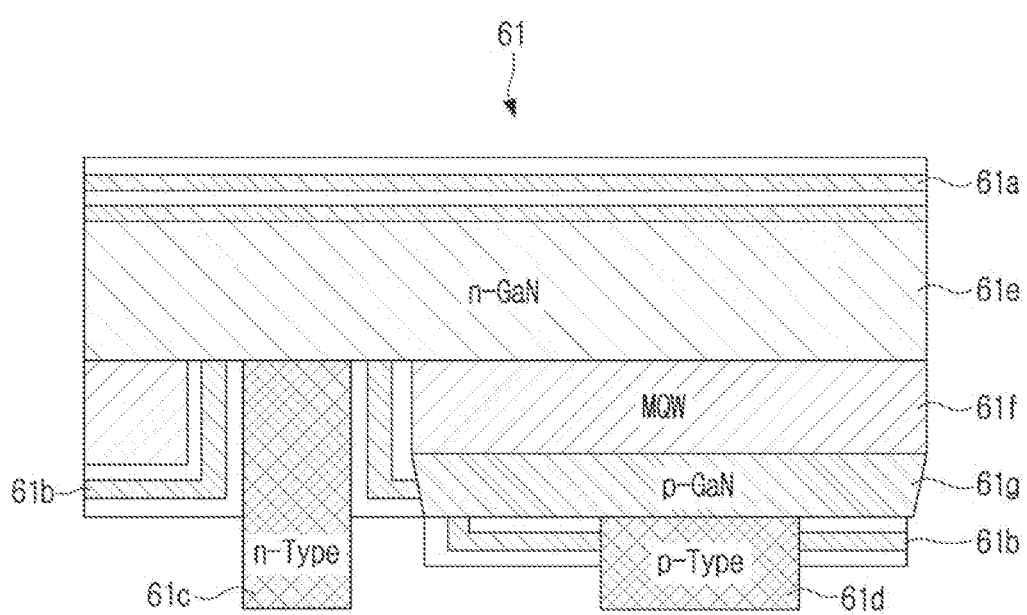
FIG. 4 is a view illustrating a self-luminescence element having a vertical cavity surface emitting laser (VCSEL) structure used in a display module according to an embodiment.
Figure 5:
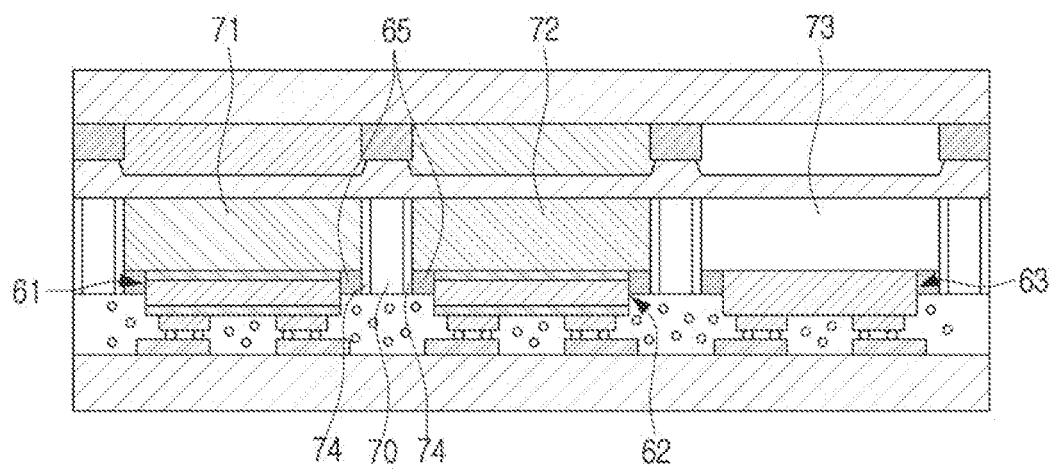
FIG. 5 is a cross-sectional view illustrating an example in which a metal film is formed on a side surface of a partition wall.
Figure 6:
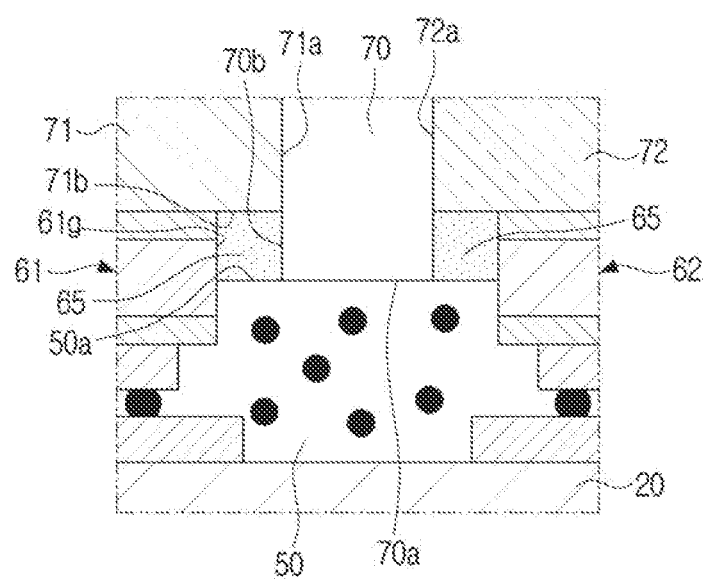
FIG. 6 is an enlarged view of a portion VI indicated in FIG. 3.

FIG. 3 is a cross-sectional view illustrating a single pixel of a display module according to an embodiment, FIG. 4 is a view illustrating a self-luminescence element having a vertical cavity surface emitting laser (VCSEL) structure used in a display module according to an embodiment, FIG. 5 is a cross-sectional view illustrating an example in which a metal film is formed on a side surface of a partition wall, and FIG. 6 is an enlarged view of a portion VI indicated in FIG. 3.

Referring to FIG. 3, one pixel 100 may be included in one-pixel area 24 (refer to FIG. 1).

The pixel 100 may include at least three micro LEDs 61, 62, and 63 emitting light of the same color, for example, light in a blue wavelength band (450 to 490 nm). In this case, two micro LEDs 61 and 62 may be VCSEL diodes including a distributed Bragg reflectors (DBR) layer, and one micro LED 63 does not include a DBR layer. However, a VCSEL diode including the DBR layer instead of a third micro LED 63 may be utilized.

The first micro LED 61, the second micro LED 62, and the third micro LED 63 may be electrically and physically connected to the TFT substrate 20 through an anisotropic conductive film (ACF) laminated on the front surface of the TFT substrate 20.

The anisotropic conductive film 50 includes a thermosetting resin, for example epoxy resin, polyurethane resin, acrylic resin, etc., and a plurality of conductive balls 51 having a relatively small diameter (for example, 3 to 15 μm) in a thermosetting resin, and each conductive ball 51 may include a polymer particle and a conductive film such as gold (Au), nickel (Ni), palladium (Pd), or the like coated on a surface of the polymer particle. The anisotropic conductive film 50 has conductivity in a compression direction and insulation in a direction perpendicular to the compression direction.

The first, second, and third micro LEDs 61, 62, and 63 may have a flip chip structure in which two chip electrodes 61c and 61d that are an anode electrode and a cathode electrode are formed on opposite sides of a light emitting surface.

When the first, second, and third micro LEDs 61, 62, and 63 are transferred to the TFT substrate 20, they are set on a surface of the anisotropic conductive film 50 attached to the TFT substrate 20. The first, second, and third micro LEDs 61, 62, and 63 are inserted into the anisotropic conductive film 50 at a predetermined depth through a thermocompression process. Accordingly, the first, second, and third micro LEDs 61, 62, and 63 may be physically fixed to the TFT substrate 20 by the anisotropic conductive film 50.

In addition, as the first micro LED 61 is pressed toward the TFT substrate 20 by the thermocompression process, the chip electrodes 61c and 61d of the first micro LED 61 may be located adjacent to substrate electrode pads 26a and 26b. In this case, the chip electrode 61c and 61d of the first micro LED 61 may be electrically connected to the substrate electrode pads 26a and 26b by the conductive ball 51 located between the chip electrodes 61c and 61d of the first micro LED 61 and the substrate electrode pads 26a and 26b. Similarly, the second and third micro LEDs 62 and 63 may also be electrically connected to the substrate electrode pad corresponding to each chip electrode through the conductive ball 51 in the same manner as the first micro LED 61.

The first and second micro LEDs 61 and 62 may each be a vertical cavity surface emitting laser (VCSEL) diode such that light is not emitted to a rear surface (a surface where the chip electrode is located) and a side surface of the first and second micro LEDs 61 and 62, but only to the light emitting surface in a direction perpendicular to the surface of the TFT substrate 20.

Accordingly, since most of the light emitted from the first and second micro LEDs 61 and 62 may be absorbed by a first color conversion layer 71 and a second color conversion layer 72 corresponding to the light emitting surface, a luminous efficiency of the display module may be improved. In the case of the third micro LED 63, since there is no corresponding color conversion layer, it may not form a VCSEL diode.

Referring to FIG. 4, a first micro LED 61 may include an active layer 61f, a first semiconductor layer 61e positioned above the active layer 61f, a second semiconductor layer 61g positioned below the active layer 61f, a first distributed Bragg reflectors (DBR) layer 61a positioned above the first semiconductor layer 61e, and a second DBR layer 61b positioned under the second semiconductor layer 61g.

The first semiconductor layer 61e is a conductivity type semiconductor layer and may be an n-type (or p-type) semiconductor layer. The second semiconductor layer 61g is a conductive semiconductor layer and may be a p-type (or n-type) semiconductor layer. An active layer 61f may be include multiple-quantum-well (MQW) or single-quantum-well (SQW).

The first and second DBR layers 61a and 61b constituting the VCSEL structure may be respectively disposed on both sides of the first micro LED 61, for example, the light-emitting surface side and the opposite side of the light-emitting surface. The first and second DBR layers 61a and 61b may include Bragg reflectors in which two thin films having a large refractive index difference, for example, a high refractive index dielectric titanium oxide ($TiO_2$) thin film and a low refractive index dielectric silicon oxide ($SiO_2$) thin film, are alternately and repeatedly deposited to a predetermined thickness. silicon nitride (SiN) may also be used as a material forming the thin film of the first and second DBR layers 61a and 61b.

When a current is applied to the first micro LED 61, the light emitted from the active layer 61f is repeatedly reflected by the first and second DBR layers 61a and 61b, respectively, to obtain a gain, and a laser operation at a single wavelength as a light emitting surface may be performed. The first micro LED 61 having a VCSEL structure having high current-to-light output conversion efficiency, may require a low threshold current and a low operation current, and may be capable of ultra-high-speed modulation and stable over a wide temperature range.

As such, as for the first micro LED 61, a first DBR layer 61a is disposed on a light emitting surface side of the first micro LED 61 with the active layer 61f interposed therebetween, and a second DBR layer 61b is disposed on the opposite side of the light emitting surface, the light emitted from the active layer 61f may be vertically emitted to the light emitting surface without being emitted to the side and rear surfaces (surface with a chip electrode) of the first micro LED 61. Accordingly, since most of the amount of light emitted from the first micro LED 61 may be absorbed by a first color conversion layer 71, the amount of light emitted by being excited by a first color conversion layer 71 may be increased compared to the related art.

A first chip electrode 61c may be electrically connected to the first semiconductor layer 61e, and may be made of any one of aluminum (Al), titanium (Ti), chromium (Cr), nickel (Ni), palladium (Pd), silver (Ag), germanium (Ge), gold (Au), or an alloy thereof. In this case, for ohmic contacts between the first chip electrode 61c and the first semiconductor layer 61e, indium tin oxide (ITO) such as an electrically conductive oxide and zinc oxide (ZnO) may be used.

A second chip electrode 61d is electrically connected to the second semiconductor layer 61g, and may be made of any one of Al, Ti, Cr, Ni, Pd, Ag, Ge, Au, or an alloy thereof. In this case, for ohmic contacts between the second chip electrode 61*d* and the second semiconductor layer 61*g*, ITO such as an electrically conductive oxide and ZnO may be used.

The second micro LED 62 may have the same structure as the first micro LED 61 described above.

Unlike the first and second micro LEDs 61 and 62, the third micro LED 63 may not include a VCSEL structure. Therefore, since there is no color conversion layer corresponding to the third micro LED 63, a light emitted from the third micro LED 63 may be emitted without passing through the color conversion layer.

Referring to FIG. 3, the pixel 100 may include first and second color conversion layers 71 and 72 corresponding to the light emitting surfaces of the first and second micro LEDs 61 and 62, respectively, and a first transparent resin layer 73 corresponding to the light emitting surface of the third micro LED 63.

The first and second color conversion layers 71 and 72 may include nano phosphors absorbing the light emitted from the first and second micro LEDs 61 and 62 to convert the light into light of different wavelength bands and emit the light of different wavelength bands. Nano phosphors refer to different physical properties compared to related phosphors having a particle diameter of several µm. For example, since a gap of an energy band, which is a quantum state energy level structure of electrons in a crystal of a nano phosphor, is large, a wavelength of the emitted light has high energy, such that a luminous efficiency may be improved. Compared to a phosphor having a bulk structure with a coated area, electrons collided with an increase in a particle density of the phosphor may effectively contribute to light emission such that the nano phosphor may improve display efficiency.

The first color conversion layer 71 may include a red nano phosphor capable of emitting light in a red wavelength band by being excited by light in a blue wavelength band emitted from the first micro LED 61. For example, the red nano phosphor may be SCASN (Si1-xCaxAlSiN3:Eu2+). In this case, the red nano phosphor may have an average value (d50) in particle size distribution of less than 0.5 µm, for example, 0.1 µm<d50<0.5 µm.

A second color conversion layer 72 may include a green nano phosphor capable of emitting light in a green wavelength band by being excited by light in a blue wavelength band emitted from the second micro LED 62. For example, green nano phosphor may be β-SiAlON (Si6-z AlzOzN8-z:Eu2+), or SrGa2S4. In this case, the green nano phosphor may have an average value (d50) in particle size distribution of less than 0.5 µm, for example, 0.1 µm<d50<0.5 µm.

The first color conversion layer 71 may be made of a material including red quantum dots emitting light in a red wavelength band as an alternative to the red nano phosphor. In this case, the second color conversion layer 72 may be made of a material including green quantum dots emitting light in a green wavelength band as an alternative to the green nano phosphor.

The first transparent resin layer 73 may be made of a material that does not affect or minimize transmittance, reflectivity, and refractive index of light emitted from the third micro LED 63. The first transparent resin layer 73 may be omitted in some cases, and in this case, an air layer may be present on light emitting surface of the third micro LED 63.

In addition, the pixel 100 may include a first color filter 81 and a second color filter 82 corresponding to the first color conversion layer 71 and the second color conversion layer 72, respectively, and include a second transparent resin layer 83 corresponding to the first transparent resin layer 73.

A first color filter 81 may be a red color filter that passes light of a wavelength band of the same color as that of light in a red wavelength band emitted from the first color conversion layer 71. A second color filter 82 may be a green color filter that passes light of a wavelength band of the same color as that of light in a green wavelength band emitted from the second color conversion layer 72.

The second transparent resin layer 83 may be made of a material that does not affect or minimize transmittance, reflectance, and refractive index of the light passing through the first transparent resin layer 73. In addition, the second transparent resin layer 83 may be an optical film capable of minimizing wasted light and improving luminance by directing a direction of light toward the front through refraction and reflection.

The first, second, and third micro LEDs 61, 62, 63 may have a predetermined thickness and may be a square having the same width and length, or a rectangle having different widths and lengths. Such a micro LED may implement real high dynamic range (HDR), improve luminance and black expression compared to OLED, and provide a high contrast ratio. A size of the micro LED may be 100 µm or less, or for example, 30 µm or less.

Referring to FIG. 3, as for the pixel 100, light emitting areas of the first, second, and third micro LEDs 61, 62, and 63 may be partitioned by a partition wall 70. The partition walls 70 may be formed in a substantially lattice shape. Each of the plurality of light emitting areas partitioned by the partition wall 70 may correspond to one sub-pixel area.

The partition wall 70 may have an upper end in close contact with a planarization layer 75 and a lower end in close contact with an upper surface of the anisotropic conductive film 50. The first and second color conversion layers 71 and 72 and the first transparent resin layer 73 may be disposed in each light emitting area partitioned by the partition wall 70.

Accordingly, light emitted to the side surfaces of the first and second color conversion layers 71 and 72 may be reflected by the partition wall 70 and emitted to the first and second color filters 81 and 82.

The partition wall 70 may have a white-like color having excellent light reflectance in order to function as a reflector. Here, the white-like color may include true white and off-white. Off-white may be any color close to white.

The partition wall 70 may be formed of a metal material having a high reflectance to function as a reflector. In addition, as shown in FIG. 5, a metal film 74 having a high light reflectance may be laminated on the side surface of the partition wall 70. In this case, the partition wall 70 may not have a white-like color.

Light emitting surfaces of the first, second, and third micro LEDs 61, 62, and 63 may be positioned at approximately the same height from the upper surface of the TFT substrate 20. In addition, the light emitting surfaces of the first, second, and third micro LEDs 61, 62, and 63 may be positioned higher than the lower end of the partition wall 70. In this case, a portion of the side surfaces of the first, second, and third micro LEDs 61, 62, and 63 may face the partition wall 70. Accordingly, light emitted from the side surface of the third micro LED 63 to which the VCSEL structure is not applied may be reflected by the partition wall 70 and emitted to the first transparent resin layer 73.

As such, the partition wall 70 may reflect the light emitted from the side surfaces of the first and second color conversion layers 71 and 72 and the light emitted from the side surface of the third micro LED 63 to emit the light to the front of the display module 10, thereby maximizing luminous efficiency.

The planarization layer 75 may be disposed between the first and second color conversion layers 71 and 72, and the first and second color filters 81 and 82. In addition, the planarization layer 75 may be disposed between the first transparent resin layer 73 and the second transparent resin layer 83.

When manufacturing a first portion 11 (refer to FIG. 10) of the display module 10, the planarization layer 75 may be laminated on the first and second color filters 81 and 82, and the second transparent resin layer 83 before forming the partition wall 70.

The planarization layer 75 may be made of a material that does not affect or minimize transmittance, reflectance, and refractive index of light passing through the first and second color conversion layers 71 and 72, and the first transparent resin layer 73.

The first and second color filters 81 and 82 and the second transparent resin layer 83 may be partitioned by a black matrix 77 formed in a grid shape. The shape of the black matrix 77 may be formed in a grid shape to correspond to the shape of the partition wall 70. In this case, a width of the black matrix 77 may be similar to the width of the partition wall 70.

A transparent cover layer 90 may be formed on the upper surface of the first and second color filters 81 and 82 and the second transparent resin layer 83. The transparent cover layer 90 may prevent the pixel 100 from being contaminated with foreign substances and may protect the pixel 100 from being damaged by an external force. The transparent cover layer 90 may be a glass substrate.

FIG. 3 illustrates only a portion in which the partition wall 70, the planarization layer 75, the black matrix 77, and the transparent cover layer 90 correspond to one pixel unit, but the partition wall 70, the planarization layer 75, The black matrix 77 and the transparent cover layer 90 may be formed to have a size approximately corresponding to a size of the TFT substrate 20.

The sizes or areas of the first, second, and third micro LEDs 61, 62 and 63 may be formed to be smaller than the sizes or areas of the first color conversion layer 71, the second color conversion layer 72, and the first transparent resin layer 73, respectively. Accordingly, a gap may be formed between the side surfaces of the first, second, and third micro LEDs 61, 62, and 63 and the partition wall 70.

Referring to FIG. 6, the gap is filled with an optical adhesive 65. The optical adhesive 65 is in close contact with a portion 61g of a side surface of the first micro LED 61, a portion 70b of a lower side of the partition wall 70, a portion 71b of a bottom surface of the first color conversion layer 71, and a portion 50a of an upper surface of the anisotropic conductive film 50, respectively. Accordingly, the partition wall 70 may be more stably fixed to the TFT substrate 20 by firmly being bonded with the surrounding structures through the optical adhesive 65.

The optical adhesive 65 is used to bond the first portion 11 and the second portion 12 of the display module 10 to be described below.

Figure 7:
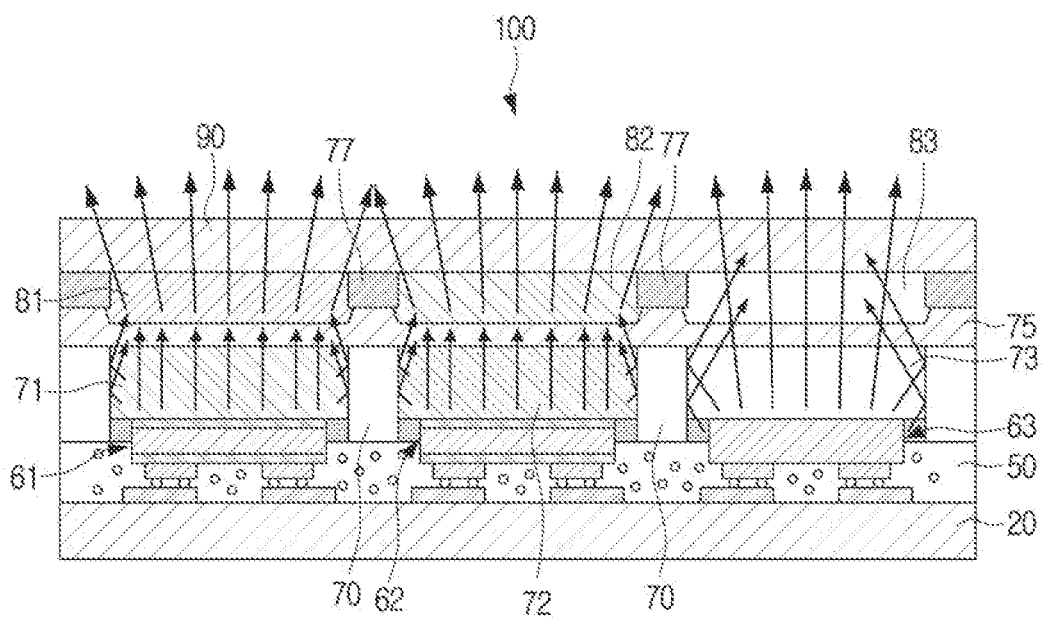
FIG. 7 is a view illustrating an example in which light emitted from a self-luminescence element of the disclosure is vertically emitted.

FIG. 7 is a view illustrating an example in which light emitted from the self-luminescence element of the disclosure is vertically emitted.

Referring to FIG. 7, the light emitted from the first and second micro LEDs 61 and 62 may be emitted in a vertical direction of the TFT substrate and absorbed by the first and second color conversion layers 71 and 72. In the first and second color conversion layers 71 and 72, light of a wavelength band corresponding to the corresponding color may be emitted from nano fluorescent particles or quantum dots. For example, the first color conversion layer 71 may emit light in a red wavelength band, and the second color conversion layer 72 may emit light in a green wavelength band.

As light emitted from the side of the first color conversion layer 71 is reflected by the partition wall 70, most of the light emitted from the first color conversion layer 71 may be emitted to the first color filter 81. The first color filter 81 may pass light in the red wavelength band from the light emitted from the first color conversion layer 71.

Similarly, most of the light emitted from the second color conversion layer 72 may be emitted to the second color filter 82 as light emitted from the side of the second color conversion layer 72 is reflected by the partition wall 70. The second color filter 82 may pass through light in the green wavelength band from the light emitted from the second color conversion layer 72.

Light emitted from the third micro LED 63 may be partially emitted not only to the light emitting surface but also to the side and rear surfaces of the third micro LED 63. In this case, the light emitted to the side of the third micro LED 63 may be reflected by the partition wall 70, pass through the first and second transparent resin layers 73 and 83, and be emitted to the outside of the display module 10. In this case, the third micro LED 63 may emit light in a blue wavelength band.

As described above, in the disclosure, light emitted from the first and second micro LEDs 61 and 62 may be mostly emitted through the light emitting surface without being emitted to the side or rear surface of the first and second micro LEDs 61 and 62, and may be absorbed into the first and second color conversion layers 71 and 72 corresponding to the micro LEDs 61 and 62, respectively, thereby improving luminous efficiency of the display module 10.

Hereinafter, a manufacturing process of the display module according to an embodiment of the disclosure will be described.

Figure 8:
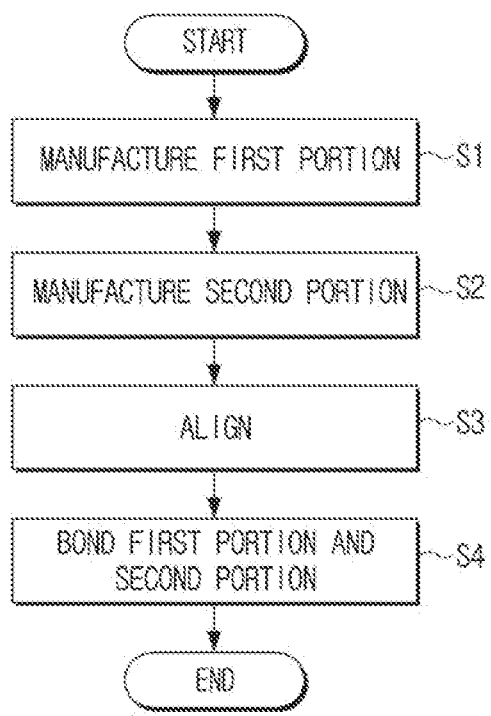
FIG. 8 is a flowchart illustrating a manufacturing process of a display module according to an embodiment.

FIG. 8 is a schematic flowchart illustrating a manufacturing process of a display module according to an embodiment.

Referring to FIG. 8, an overall manufacturing process of the display module 10 according to an embodiment of the disclosure will be schematically described as follows.

A color filter, a planarization layer, a partition wall, and a color conversion layer may be sequentially formed on a glass substrate to manufacture a first portion 11 (refer to FIG. 10) (S1), and manufacture a second portion 12 (refer to FIG. 12) by transferring a plurality of micro LEDs (S2) to the TFT substrate 20 separately from the first portion.

After the second portion 12 is set on a die, the first portion 11 may be disposed on the upper side of the second portion 12 at a predetermined interval.

After aligning the first and second portions 11 and 12 in order to bond the first and second portions 11 and 12 to each other (S3), the first portion 11 may be pressed toward the second portion 12 to be bonded together (S4).

Hereinafter, a manufacturing process of the first and second portions of the display module 10 and a bonding process of the first and second portions of the display module 10 according to an embodiment of the disclosure will be sequentially described in detail with reference to the drawings.

Figure 9:
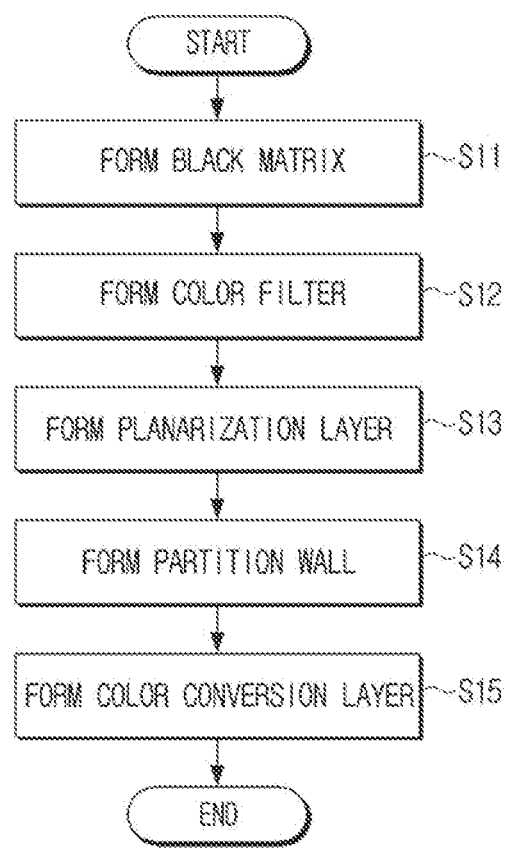
FIG. 9 is a flowchart illustrating a manufacturing process of a first portion of a display module according to an embodiment.
Figure 10:
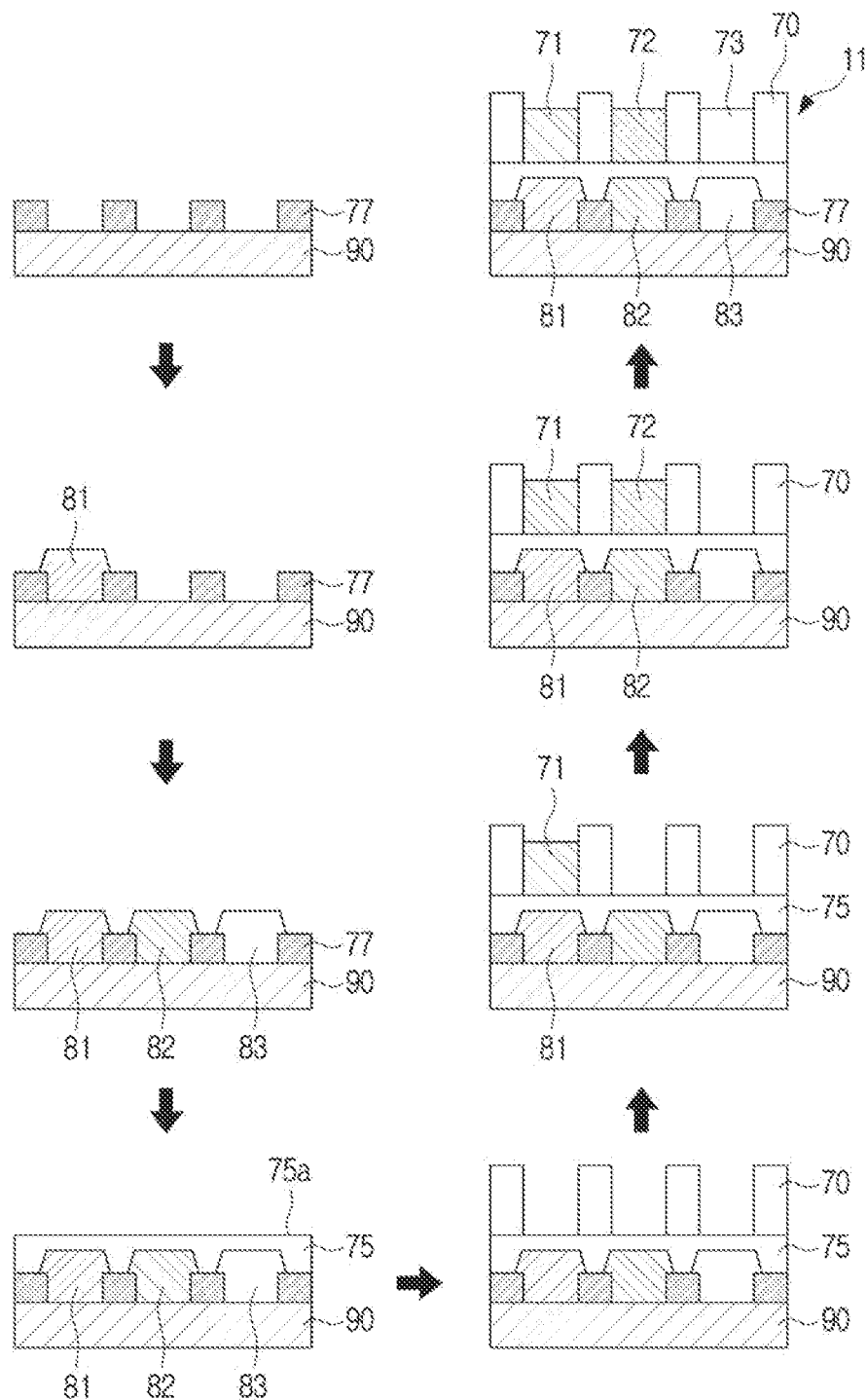
FIG. 10 is a process diagram illustrating a first portion of a display module according to an embodiment.

FIG. 9 is a flowchart illustrating a manufacturing process of a first portion of a display module according to an embodiment, and FIG. 10 is a process diagram illustrating a first portion of a display module according to an embodiment. In FIG. 10, the entire first portion 11 of the display module 10 is not shown, but an enlarged portion corresponding to one pixel is illustrated.

Referring to FIGS. 9 and 10, the first portion 11 of the display module 10 may be manufactured through the following procedure.

A black matrix 77 may be formed in a grid shape on one surface of the transparent cover layer 90 (S11).

The transparent cover layer 90 may use, for example, a rectangular or rectangular glass substrate having a predetermined thickness. A size of the transparent cover layer 90 may approximately correspond to a size of the TFT substrate 20.

As the black matrix 77 is formed in a grid shape, a plurality of cells may be formed, and each cell may be a sub-pixel area. As described above, a color filter may be formed in a predetermined cell among the plurality of cells of the black matrix 77 (S12).

For example, in order to form the first color filter 81, a red material may be uniformly applied entirely to one surface of the transparent cover layer 90 on which the black matrix 77 is formed. After that, only areas where red should remain are exposed using a mask, and the red material may be removed through development in the remaining areas.

In order to form the second color filter 82, a green material may be uniformly applied entirely to one surface of the transparent cover layer 90. After that, only areas where green should remain are exposed using a mask, and the green material may be removed through development in the remaining areas.

Finally, in order to form the second transparent resin layer 83, a transparent resin material may be uniformly applied entirely to one surface of the transparent cover layer 90. Then, only areas where the transparent resin should remain are exposed using a mask, and the transparent resin material may be removed through development in the remaining areas.

A slit method that evenly coats the entire surface using a printer nozzle, and a spin method that sprays liquid in the center and then rotates a plate may be applied to a method of applying the color filter material and the transparent resin material to the transparent cover layer 90.

When the first and second color filters 81 and 82 and the second transparent resin layer 83 are formed, a planarization layer 75 covering the first and second color filters 81 and 82 and the second transparent resin layer 83 may be formed such that the partition wall 70 may be stacked thereon (S13).

An upper surface 75a of the planarization layer 75 has a flatness sufficient to form the partition wall 70 at a uniform height. The planarization layer 75 may be formed of a transparent material that does not affect light transmittance, reflectance, and refractive index.

Lattice-shaped partition walls 70 may be formed on the upper surface 75a of the planarization layer 75 (S14). Each cell formed by the partition wall 70 may be formed at a position corresponding to each cell formed by the aforementioned black matrix 77. In this case, each cell formed by the partition wall 70 corresponds to a sub-pixel area.

After the partition wall 70 is formed, a first color conversion layer 71 and a second color conversion layer 72 may be sequentially patterned in each cell using a color conversion material, for example, nano phosphor or quantum dot material, through an inkjet printing method (S15).

As another method of forming the first and second color conversion layers 71 and 72, the nano phosphor or quantum dot material may be mixed with a photoresist to form through coating, exposure and development, similar to the method of manufacturing the color filter described above.

The first color conversion layer 71 may be formed of a red nano phosphor capable of emitting light in a red wavelength band, and the second color conversion layer 72 may be formed of a green nano phosphor capable of emitting light in a green wavelength band. However, embodiments are not limited thereto. For example, the first color conversion layer 71 may be formed of a red quantum dot material, and the second color conversion layer 72 may be formed of a green quantum dot material.

After patterning the first and second color conversion layers 71 and 72 in each cell, a first transparent resin layer 73 may be formed by patterning the transparent resin material through the inkjet printing method on empty cells in which the first and second color conversion layers 71 and 72 are not formed.

The first portion 11 constituting the upper plate of the display module 10 may be formed through the process described above.

Figure 11:
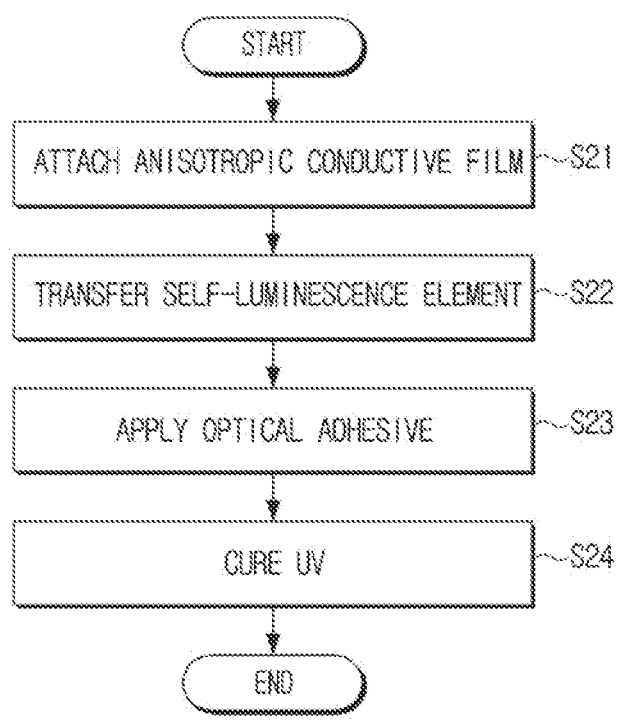
FIG. 11 is a flowchart illustrating a manufacturing process of a second portion of a display module according to an embodiment.
Figure 12:
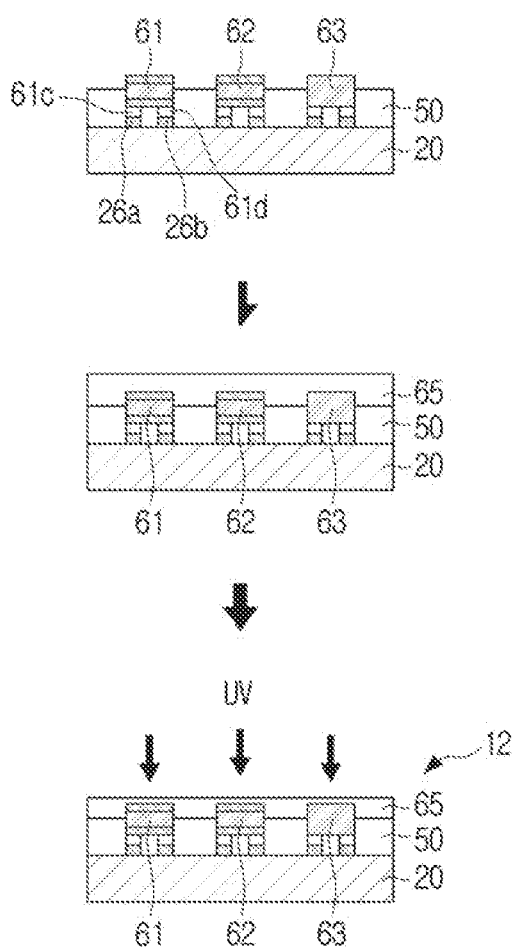
FIG. 12 is a process diagram illustrating a second portion of a display module according to an embodiment.

FIG. 11 is a flowchart illustrating a manufacturing process of a second portion of a display module according to an embodiment. FIG. 12 is a process diagram illustrating a second portion of a display module according to an embodiment. FIG. 12 does not illustrate the entire second portion 12 of the module 10, but enlarges and illustrates a part corresponding to one pixel.

Referring to FIGS. 11 and 12, an anisotropic conductive film 50 is laminated on a front surface of the TFT substrate 20 (S21).

In this case, a plurality of substrate electrode pads 26a and 26b are arranged at regular intervals on the front surface of the TFT substrate 20.

After attaching anisotropic conductive film 50, a plurality of micro LEDs may be transferred to the TFT substrate 20 (S22).

The micro LED transfer process may be performed through a laser transfer method, a rollable transfer method, a pick-and-place transfer method, or the like. In this case, a first, second, and third micro LEDs 61, 62, and 63 may be transferred from an epi substrate to a relay substrate or interposer, respectively, and then transferred from each relay substrate to the TFT substrate 20 which is the target substrate.

The first and second micro LEDs 61 and 62 may be blue micro LEDs that have a VCSEL structure that includes DBR layers are formed on top and bottom of the micro LED, respectively, and emit light in a blue wavelength band. The third micro LED 63 may be a blue micro LED that does not have the VCSEL structure and emits light in a blue wavelength band.

An optical adhesive 65 for bonding the first portion 11 and the second portion 12 may be applied to the entire surface of the TFT substrate 20 (S23).

The optical adhesive 65 may be applied to the TFT substrate 20 to cover all of the plurality of micro LEDs 61, 62 and 63. The optical adhesive 65 may be a UV-curing silicone rubber (Di-methyl siloxane) having a property of being cured after a predetermined time after UV exposure.

The optical adhesive 65 may be cured by radiating UV for a predetermined time (S24).

Through the process described above, the second portion 12 constituting a lower plate of the display module 10 may be formed.

Hereinafter, a process of manufacturing the display module 10 by bonding the first portion 11 and the second portion 12 to each other will be described.

Figure 13:
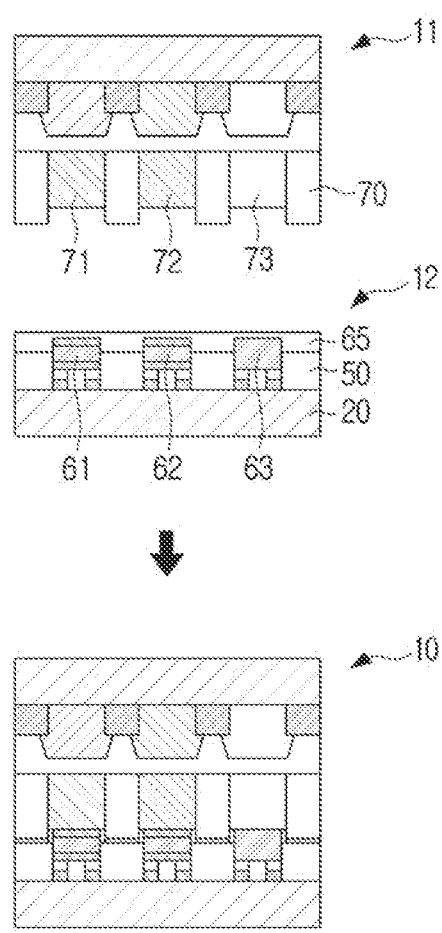
FIG. 13 is a process diagram of coupling a first portion and a second portion of a display module according to an embodiment.

FIG. 13 is a process diagram of coupling a first portion and a second portion of a display module according to an embodiment.

Referring to FIG. 13, after the second portion 12 is seated on a die, the first portion 11 may be disposed on the upper side of the second portion 12 at a predetermined interval.

In order to bond the first and second portions 11 and 12 to each other, the first portion 11 may be inverted such that the color conversion layer of the first part 11 corresponds to the micro LED of the second part 12 to align with the bonding position.

In this case, the first and second portions 11 and 12 may be arranged to be parallel to each other on the same plane.

After the first and second portions 11 and 12 are aligned to the bonding position, the first and second portions 11 and 12 are bonded together by bringing the first portion 11 into close contact with the second portion 12 with a predetermined pressure. In this case, the first and second portions 11, 12 may be attached to each other by means of the optical adhesive 65.

After bonding the first and second portions 11 and 12, the optical adhesive 65 may be cured to firmly bond the first and second portions 11 and 12.

Through these processes, the display module 10 according to an embodiment of the disclosure may be manufactured.

Hereinafter, a display module 10a according to another embodiment of the disclosure will be described.

The display module 10 described above according to an embodiment of the disclosure applies a blue micro LED as a self-luminescence element for displaying an image, but the display module 10a according to another embodiment of the disclosure may apply UV micro LED as a self-luminescence element for displaying an image.

Figure 14:
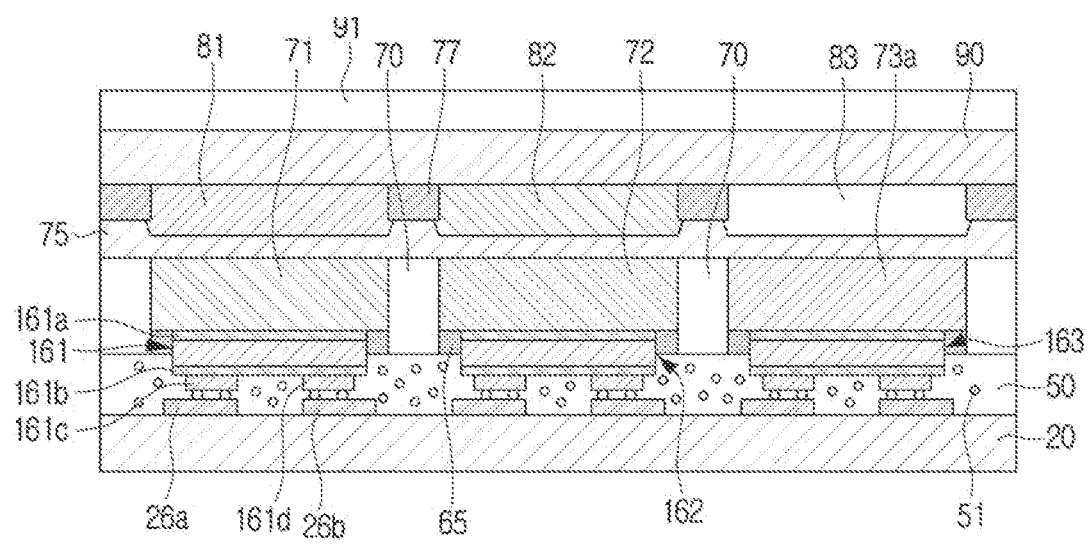
FIG. 14 is a cross-sectional view illustrating a single pixel of a display module according to another embodiment.

FIG. 14 is a cross-sectional view illustrating a single pixel of a display module according to another embodiment.

In describing the display module 10a according to another embodiment of the disclosure, the same reference numerals are given to the same components as those of the display module 10 described above, and descriptions thereof are omitted, and a different configuration from the display module 10 described above will be mainly described.

Referring to FIG. 14, the display module 10a (see FIG. 19A) has a TFT substrate 20 and a plurality of pixels 100A are arranged on the TFT substrate 20.

One pixel 100A includes a first UV micro LED 161, a second UV micro LED 162, and a third UV micro LED 163 emitting light in an ultraviolet wavelength band (360 to 410 nm). A first UV micro LED 161 may include a VCSEL structure, for example, a first DBR layer 161a disposed on the light-emitting surface side and a second DBR layer 161b disposed on the opposite side of the light-emitting surface. The second and third UV micro LEDs 161 and 163 may include the same VCSEL structure as the first UV micro LED 161.

The first and second DBR layers 161a and 161b include Bragg reflectors in which two thin films having a large refractive index difference (for example, a high refractive index dielectric TiO2 thin film and a low refractive index dielectric SiO2 thin film) are alternately deposited to a predetermined thickness. SiN may also be used as a material forming the thin film of the first and second DBR layers 61a and 61b.

Since most of the light emitted from the first, second, and third UV micro LEDs 161, 162, and 163 may be absorbed by first, second, and third color conversion layers 71, 72, and 73a corresponding to the light emitting surface, luminous efficiency of the display module. may be improved.

The first, second, and third color conversion layers 71, 72, and 73a may be disposed at positions corresponding to the first, second, and third UV micro LEDs 161 and 163, respectively.

The first, second, and third color conversion layers 71, 72 and 73a may include nano phosphors absorbing the light emitted from the first, second, and third micro LEDs 161, 162, and 163, converting the light into light of different wavelength bands and emitting the light of different wavelength bands.

The first color conversion layer 71 may include a red nano-phosphor capable of emitting light in a red wavelength band by being excited by light in an ultraviolet wavelength band emitted from a first UV micro LED 161. For example, the red nano-phosphor may be SCASN (Si1-xCaxAlSiN3:Eu2+). In this case, the red nano-phosphor may have an average particle size distribution (d50) of less than 0.5 μm, or for example, 0.1 μm<d50<0.5 μm.

The second color conversion layer 72 may include a green nano-phosphor capable of emitting light in a green wavelength band by being excited by light in an ultraviolet wavelength band emitted from a second UV micro LED 162. For example, the green nano-phosphor may be β-SiAlON (Si6-zAlzOzN8'1z:Eu2+) or SrGa2S4. In this case, the green nano-phosphor may have an average particle size distribution (d50) of less than 0.5 μm, or for example 0.1 μm<d50<0.5 μm.

The third color conversion layer 73a may include a blue nano phosphor capable of emitting light in a blue wavelength band by being excited by light of an ultraviolet wavelength band emitted from a third UV micro LED 163. For example, the blue nano-phosphor may be BAM (BaMgxAlyOz:Eun+). In this case, the blue nano-phosphor may have an average particle size distribution (d50) of less than 0.5 μm, or for example, 0.1 μm<d50<0.5 μm.

The first color filter 81, the second color filter 82, and the second transparent resin layer 83 may be disposed above the first, second, and third color conversion layers 71, 72 and 73a, respectively.

A size or area of the first, second, and third UV micro LEDs 161, 162, and 163 may be formed to be smaller than a size or area of the first, second, and third color conversion layers 71, 72, and 73a, respectively. Accordingly, a gap may be formed between side surfaces of the first, second, and third micro LEDs 61, 62, and 63 and the partition wall 70, and the gap may be filled with the optical adhesive 65. Accordingly, the partition wall 70 may be more stably fixed to the TFT substrate 20 by firmly being bonded with a surrounding structure through the optical adhesive 65.

In addition, a thin film UV blocking filter 91 may be laminated on one surface of the transparent cover layer 90. The UV blocking filter 91 may block UV rays emitted from the first, second, and third UV micro LEDs 161, 162, and 163. The UV blocking filter 91 may have a transmittance of 10% or less with respect to a wavelength of 400 nm or less.

Hereinafter, a manufacturing process of the first and second portions of the display module 10a and a bonding process of the first and second portions of the display module 10a according to another embodiment of the disclosure will be sequentially described in detail with reference to the drawings.

Figure 15:
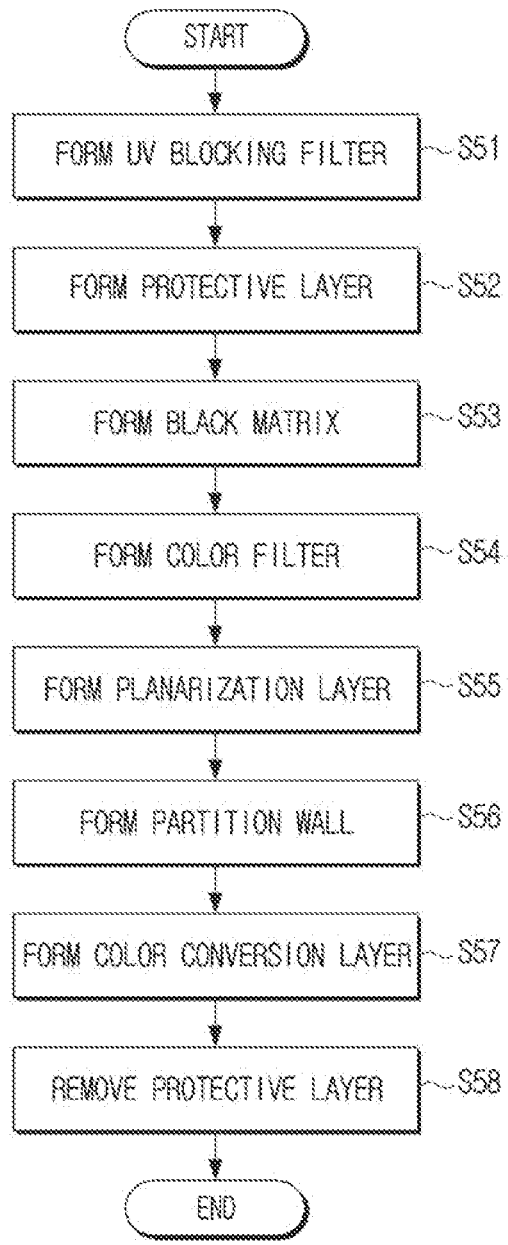
FIG. 15 is a flowchart illustrating a manufacturing process of a first portion of a display module according to another embodiment.
Figure 16:
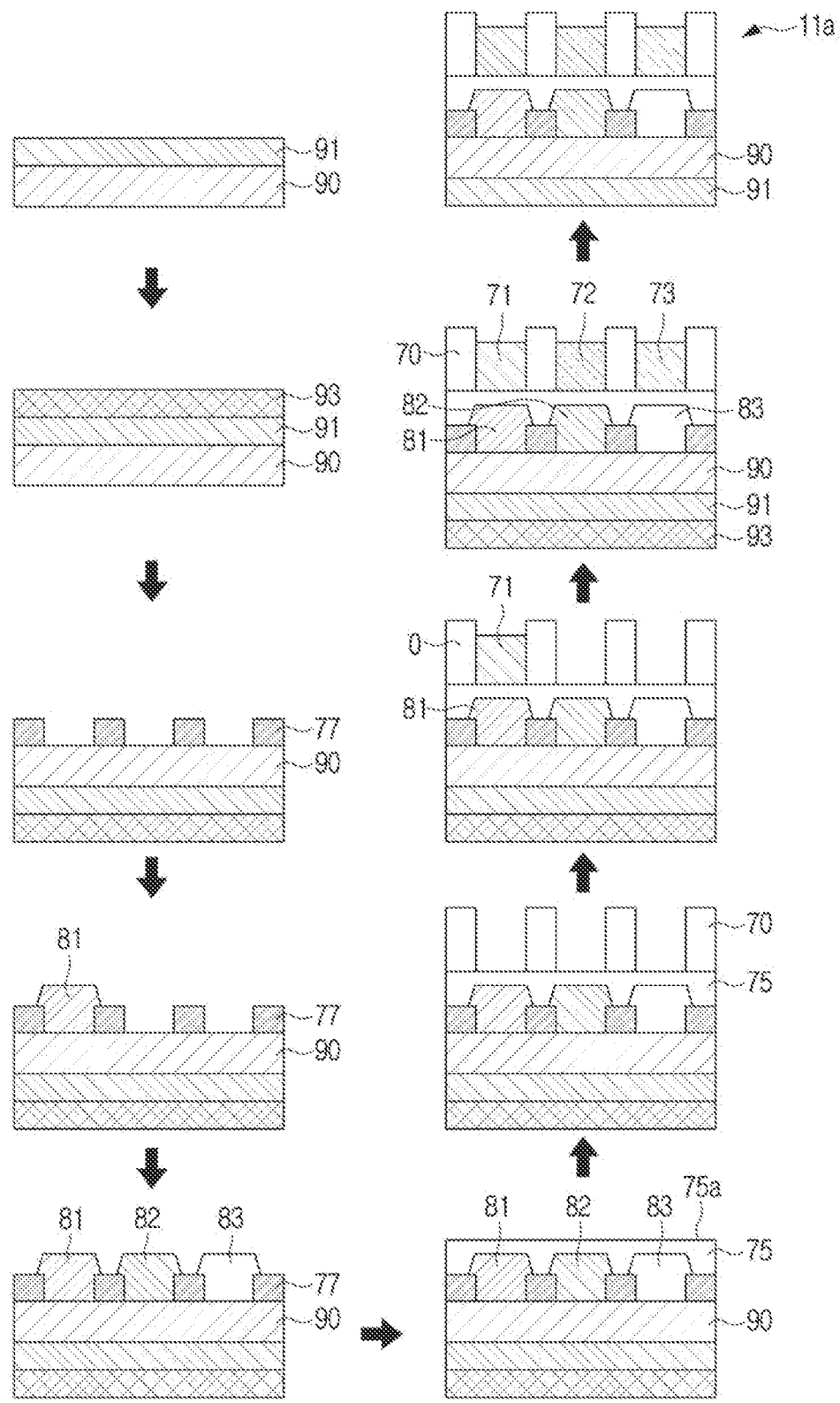
FIG. 16 is a process diagram of a first portion of a display module according to another embodiment.

FIG. 15 is a flowchart illustrating a manufacturing process of a first portion of a display module according to another embodiment. FIG. 16 is a process diagram of a first portion of a display module according to another embodiment. FIG. 16 does not illustrate an entire first portion 11a of the module 10a, but enlarges and illustrates a part corresponding to one pixel.

Referring to FIGS. 15 and 16, the first portion 11a of the display module 10a may be manufactured through the following procedure.

The thin film UV blocking filter 91 may be formed on one surface of the transparent cover layer 90 (S51). The UV blocking filter 91 may block UV rays emitted from the first, second, and third UV micro LEDs 161, 162, and 163.

A protective layer 93 may be laminated on the UV blocking filter 91 to protect the UV blocking filter 91 while the first portion 11a is manufactured (S52).

Then, the black matrix 77 may be formed in a form of a grid on the other surface of the transparent cover layer 90 (S53).

The transparent cover layer 90 may use, for example, a rectangular or rectangular glass substrate having a predetermined thickness. A size of the transparent cover layer 90 may approximately correspond to a size of the TFT substrate 20.

As the black matrix 77 is formed in a grid shape, a plurality of cells are formed, and each cell may be a sub-pixel area. As described above, a color filter may be formed in a predetermined cell among a plurality of cells of the black matrix 77 (S54).

For example, in order to form the first color filter 81, a red material may be uniformly applied entirely to one surface of the transparent cover layer 90 on which the black matrix 77 is formed. Then, only areas where red should remain are exposed using a mask, and the red material is removed through development in the remaining areas.

In order to form the second color filter 82, a green material may be uniformly applied entirely to one surface of the transparent cover layer 90. Then, only areas where green should remain are exposed using a mask, and the green material is removed through development in the remaining areas.

In addition, in order to form the second transparent resin layer 83, a transparent resin material may be uniformly applied entirely to one surface of the transparent cover layer 90. Then, only areas where the transparent resin should remain are exposed using a mask, and the transparent resin material is removed through development in the remaining areas.

A slit method that evenly coats the entire surface using a printer nozzle, and a spin method that sprays liquid in the center and then rotates a plate may be applied to a method of applying the color filter material and the transparent resin material to the transparent cover layer 90.

When the first and second color filters 81 and 82 and the second transparent resin layer 83 are formed, the planarization layer 75 covering the first and second color filters 81 and 82 and the second transparent resin layer 83 may be formed such that the partition wall 70 may be stacked thereon (S55).

The upper surface 75a of the planarization layer 75 has a flatness sufficient to form the partition wall 70 at a uniform height. The planarization layer 75 may be formed of a transparent material that does not affect light transmittance, reflectance, and refractive index.

Lattice-shaped partition walls 70 may be formed on the upper surface 75a of the planarization layer 75 (S56). Each cell formed by the partition wall 70 may be formed at a position corresponding to each cell formed by the aforementioned black matrix 77. In this case, each cell formed by the partition wall 70 corresponds to a sub-pixel area.

After the partition wall 70 is formed, the first, second, and third color conversion layers 71, 72, and 73a may be sequentially patterned in each cell using a color conversion material, for example, nano phosphor, through an inkjet printing method (S57).

The first, second, and third color conversion layers 71, 72, and 73a may also be formed by coating, exposing, and developing a photoresist mixed with a nano phosphor, similar to the method of manufacturing the color filter described above.

The first color conversion layer 71 may be formed of a red nano phosphor capable of emitting light in a red wavelength band, and the second color conversion layer 72 may be formed of a green nano phosphor capable of emitting light in a green wavelength band. The third color conversion layer 73a may be formed of a blue nano-phosphor capable of emitting light in a blue wavelength band.

The protective layer 93 may be removed from the UV blocking filter 91 (S58). Accordingly, the first portion 11a constituting an upper plate of the display module 10a may be formed.

Figure 17:
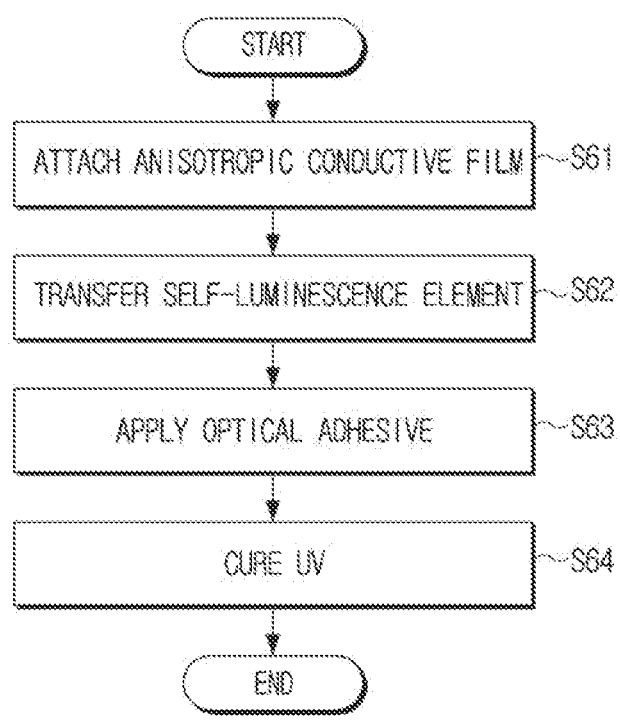
FIG. 17 is a flowchart illustrating a manufacturing process of a second portion of a display module according to another embodiment.
Figure 18:
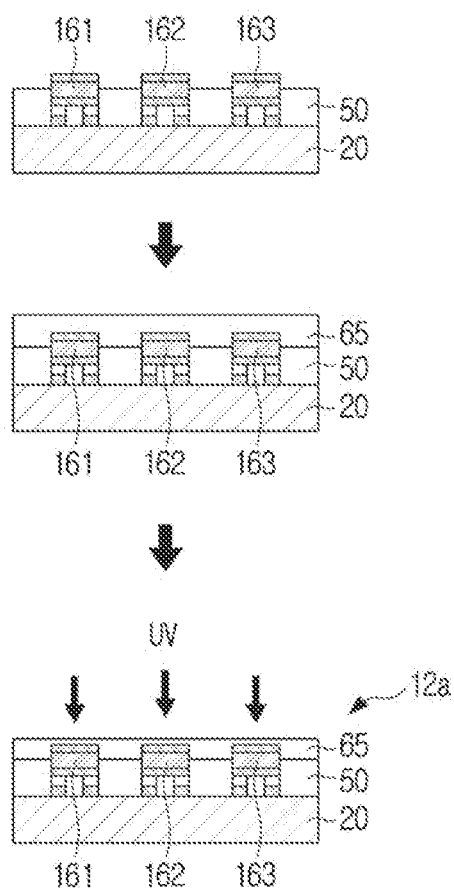
FIG. 18 is a process diagram of a second portion of a display module according to another embodiment.

FIG. 17 is a flowchart illustrating a manufacturing process of a second portion of a display module according to another embodiment. FIG. 18 is a process diagram of a second portion of a display module according to another embodiment. FIG. 18 does not illustrate an entire second portion 12a of the module 10a, but enlarges and illustrates a portion corresponding to one pixel.

Referring to FIGS. 17 and 18, the anisotropic conductive film 50 may be laminated on a front surface of the TFT substrate 20 (S61). In this case, a plurality of substrate electrode pads 26a and 26b may be arranged at regular intervals on the front surface of the TFT substrate 20.

After attaching the anisotropic conductive film 50 to the TFT substrate 20, a plurality of UV micro LEDs 161, 162, and 163 may be transferred to the TFT substrate 20 (S62).

The UV micro LED transfer process may be performed through a laser transfer method, a rollable transfer method, a pick-and-place transfer method, or the like. In this case, the first, second, and third UV micro-LED 161, 162, 163 may be transferred from an epi substrate to a relay substrate or interposer, respectively, and then transferred from each relay substrate to the TFT substrate 20 which is the target substrate.

The first, second, and third UV micro LEDs 161, 162, and 163 may have a VCSEL structure including DBR layers are formed on top and bottom of the micro LED, respectively.

The optical adhesive 65 for bonding the first portion 11a and the second portion 12a may be applied to the entire surface of the TFT substrate 20 (S63).

The optical adhesive 65 may be applied to the TFT substrate 20 to cover all of the plurality of micro LEDs 161, 162 and 163. The optical adhesive 65 may be a UV-curing silicone rubber (Di-methyl siloxane) having a property of being cured after a predetermined time after UV exposure.

The optical adhesive 65 may be cured by being irradiated with UV for a predetermined time (S64).

Through the process described above, the second portion 12a constituting a lower plate of the display module 10a may be formed.

Hereinafter, a process of manufacturing the display module 10a by bonding the first portion 11a and the second portion 12a to each other will be described.

Figure 19:
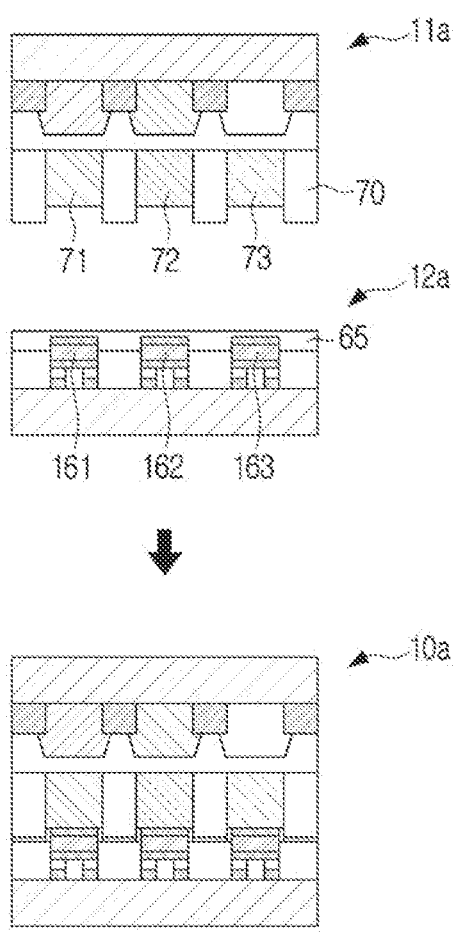
FIG. 19 is a process diagram of coupling a first portion and a second portion of a display module according to another embodiment.

FIG. 19 is a process diagram of coupling a first portion and a second portion of a display module according to another embodiment.

Referring to FIG. 19, after the second portion 12a is seated on a die, the first portion 11a is disposed above the second portion 12a at a predetermined interval.

In order to bond the first and second portions 11a and 12a to each other, the first portion 11a may be inverted such that the color conversion layers 71, 72, 73a of the first portion 11a are aligned in the bonding position to correspond to the respective UV micro LEDs 161, 162 and 163 of the second portion 12a.

In this case, the first and second portions 11a and 12a may be arranged to be parallel to each other on the same plane.

After the first and second portions 11a and 12a are aligned to the bonding position, the first and second portions 11a and 12a are bonded together by bringing the first portion 11 into close contact with the second portion 12 with a predetermined pressure. In this case, the first and second portions 11a and 12a may be attached to each other by means of the optical adhesive 65.

After bonding the first and second portions 11a and 12a, the optical adhesive 65 may be cured to firmly bond the first and second portions 11a and 12a.

Through these processes, the display module 10a according to another embodiment of the disclosure may be manufactured.

The various example embodiments aforementioned were explained separately, but each of the example embodiments may not necessarily be realized separately, and the configuration and operation of each of the example embodiments may be realized in combinations with at least one other example embodiment.

The foregoing example embodiments and advantages are merely examples and are not to be construed as limiting the disclosure. The example embodiments may be readily applied to other types of apparatuses. Also, the description of the example embodiments of the disclosure is intended to be illustrative, and not to limit the scope of the claims, and many alternatives, modifications, and variations will be apparent to those skilled in the art.

What is claimed is:

1. A display module comprising:
   a substrate; and
   a plurality of pixels provided on the substrate,
   wherein each pixel of the plurality of pixels comprises:
   a first inorganic light emitting element comprising a distributed Bragg reflectors (DBR) layer;
   a second inorganic light emitting element comprising a DBR layer;
   a third inorganic light emitting element;
   a first color conversion layer provided adjacent to the first inorganic light emitting element;
   a second color conversion layer provided adjacent to the second inorganic light emitting element;
   a first color filter provided adjacent to the first color conversion layer;
   a second color filter provided adjacent to the second color conversion layer; and
   an anisotropic layer adjacent to the first inorganic light emitting element, the second inorganic light emitting element and the third inorganic light emitting element, the anisotropic layer comprising a plurality of conductive balls;
   an optical adhesive provided on a portion of a side surface of the first inorganic light emitting element and on a first portion of a lower surface of the first light conversion layer that does not overlap with the first inorganic light emitting element in a vertical direction;
   a passivation layer between the first color conversion layer and the first color filter,
   wherein a size of the first color conversion layer is larger than a size of the first inorganic light emitting element, and a size of the second color conversion layer is larger than a size of the second inorganic light emitting element, and
   wherein an optical adhesive is in contact with a portion of a side surface of the first inorganic light emitting element, a portion of a lower side of the partition wall, a portion of a bottom surface of the first color conversion layer, and a portion of an upper surface of the anisotropic conductive film, respectively.

2. The display module as claimed in claim 1, wherein each of the first inorganic light emitting element, the second inorganic light emitting element, and the third inorganic light emitting element is a blue micro light emitting diode (LED).

3. The display module as claimed in claim 1, further comprising a partition wall that partitions the first inorganic light emitting element, the second inorganic light emitting element and the third inorganic light emitting element, and
   wherein the partition wall is configured to reflect light emitted from a side surface of the first color conversion layer and reflect light emitted from a side surface of the second color conversion layer.

4. The display module as claimed in claim 3, wherein the partition wall has a white color.

5. The display module as claimed in claim 3, further comprising a metal film provided on a surface of the partition wall.

6. The display module as claimed in claim 3, wherein side surfaces of the first inorganic light emitting element, the second inorganic light emitting element, and the third inorganic light emitting element are adhered to the partition wall by an optical adhesive.

7. The display module as claimed in claim 6, wherein a first portion of a surface of the first color conversion layer contacts the optical adhesive and the first portion does not correspond to a light emitting surface of the first inorganic light emitting element, and
   wherein a second portion of a surface of the second color conversion layer contacts the optical adhesive and the second portion does not correspond to a light emitting surface of the second inorganic light emitting element.

8. The display module as claimed in claim 6, wherein the optical adhesive is a ultraviolet (UV) curing silicone rubber.

9. The display module as claimed in claim 2, wherein the first color conversion layer includes a first color conversion material configured to emit light in a red wavelength band, and
   wherein the second color conversion layer includes a second color conversion material configured to emit light in a green wavelength band.

10. The display module as claimed in claim 9, wherein the first color conversion material is a red nano phosphor, and
    wherein the second color conversion material is a green nano phosphor.

11. The display module as claimed in claim 10, wherein the red nano phosphor is $Si_{1-x}Ca_xAlSiN_3:Eu^{2+}$.

12. The display module as claimed in claim 10, wherein the green nano phosphor is $Si_{6-z}Al_zO_zN_{8-z}:Eu^{2+}$ or $SrGa_2S_4$.

13. The display module as claimed in claim 10, wherein each of the red nano phosphor and the green nano phosphor has an average value ($d_{50}$) in particle size distribution of less than 0.5 μm.

14. A display module comprising:
a substrate; and
a plurality of pixels provided on the substrate,
wherein each pixel of the plurality of pixels comprises:
a first inorganic light emitting element comprising a distributed Bragg reflectors (DBR) layer;
a second inorganic light emitting element comprising a DBR layer;
a third inorganic light emitting element comprising a DBR layer;
a first color conversion layer provided adjacent to the first inorganic light emitting element;
a second color conversion layer provided adjacent to the second inorganic light emitting element;
a third color conversion layer provided adjacent to the third inorganic light emitting element;
a first color filter provided adjacent to the first color conversion layer;
a second color filter provided adjacent to the second color conversion layer;
a third color filter provided adjacent to the third color conversion layer; and
an anisotropic layer adjacent to the first inorganic light emitting element, the second inorganic light emitting element and the third inorganic light emitting element, the anisotropic layer comprising a plurality of conductive balls;
an optical adhesive provided on a portion of a side surface of the first inorganic light emitting element and on a first portion of a lower surface of the first light conversion layer that does not overlap with the first inorganic light emitting element in a vertical direction;
a passivation layer between the first color conversion layer and the first color filter,
wherein a size of each of the first color conversion layer, the second color conversion layer, and the third color conversion layer is larger than a size of each of the first inorganic light emitting element, the second inorganic light emitting element, and the third inorganic light emitting element, and
wherein an optical adhesive is in contact with a portion of a side surface of the first inorganic light emitting element, a portion of a lower side of the partition wall, a portion of a bottom surface of the first color conversion layer, and a portion of an upper surface of the anisotropic conductive film, respectively.

15. The display module as claimed in claim 14, wherein the first inorganic light emitting element, the second inorganic light emitting element, and the third inorganic light emitting element are partitioned by a partition wall, and
wherein the partition wall is configured to reflect light emitted from a side surface of the first color conversion layer, reflect light emitted from a side surface of the second color conversion layer, and reflect light emitted from a side surface of the third color conversion layer.

16. The display module as claimed in claim 15, wherein the partition wall has a white color.

17. The display module as claimed in claim 15, wherein a metal film is provided on a surface of the partition wall.

18. The display module as claimed in claim 15, wherein a side surface of each of the first inorganic light emitting element, the second inorganic light emitting element, and the third inorganic light emitting element is adhered to the partition wall by an optical adhesive.

* * * * *